(12) United States Patent
Ishizaki et al.

(10) Patent No.: US 10,937,943 B2
(45) Date of Patent: Mar. 2, 2021

(54) PIEZOELECTRIC COMPOSITION AND PIEZOELECTRIC DEVICE

(71) Applicant: TDK CORPORATION, Tokyo (JP)

(72) Inventors: Makoto Ishizaki, Tokyo (JP); Keisuke Teranishi, Tokyo (JP); Masashi Kitazaki, Tokyo (JP); Mingyu Chen, Tokyo (JP); Kazuki Fukasawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 359 days.

(21) Appl. No.: 15/906,292

(22) Filed: Feb. 27, 2018

(65) Prior Publication Data

US 2018/0248106 A1    Aug. 30, 2018

(30) Foreign Application Priority Data

Feb. 27, 2017   (JP) .............................. JP2017-035354

(51) Int. Cl.
| | |
|---|---|
| *H01L 41/187* | (2006.01) |
| *C04B 35/453* | (2006.01) |
| *C04B 35/626* | (2006.01) |
| *C04B 35/634* | (2006.01) |
| *C04B 35/638* | (2006.01) |
| *H01L 41/43* | (2013.01) |
| *C04B 35/64* | (2006.01) |

(Continued)

(52) U.S. Cl.
CPC ........ *H01L 41/1878* (2013.01); *C01G 49/009* (2013.01); *C04B 35/26* (2013.01); *C04B 35/453* (2013.01); *C04B 35/6261* (2013.01); *C04B 35/62695* (2013.01); *C04B 35/638* (2013.01); *C04B 35/63416* (2013.01); *C04B 35/64* (2013.01); *H01L 41/43* (2013.01); *C01P 2002/52* (2013.01); *C01P 2002/54* (2013.01); *C01P 2006/40* (2013.01); *C04B 2235/3215* (2013.01); *C04B 2235/3222* (2013.01); *C04B 2235/3236* (2013.01); *C04B 2235/3274* (2013.01); *C04B 2235/3298* (2013.01); *C04B 2235/604* (2013.01); *C04B 2235/6567* (2013.01); *C04B 2235/768* (2013.01)

(58) Field of Classification Search
CPC ..... H01L 41/1878; C04B 35/26; C04B 35/44; C04B 35/4682
See application file for complete search history.

(56) References Cited

U.S. PATENT DOCUMENTS 8,419,967 B2 * 4/2013 Sasaki ................. C23C 14/0036
                                                                  252/62.9 R
2014/0354738 A1   12/2014 Yabuta et al.

FOREIGN PATENT DOCUMENTS

JP           2013-191751 A        9/2013

OTHER PUBLICATIONS

Cen, Zhenyong el al, "Remarkably High-Temperature Stability of Bi(Fe1-xAlx)03-BaTi03 Solid Solution With Near-Zero Temperature Coefficient of Piezoelectric Properties", Journal of the American Ceramic Society, Jul. 2013, vol. 96, No. 7, pp. 2252-2256.*

(Continued)

*Primary Examiner* — C Melissa Koslow
(74) *Attorney, Agent, or Firm* — Oliff PLC

(57) ABSTRACT

The piezoelectric composition is represented by the following Chemical Formula (1):

$$x[Bi_mFeO_3]\text{-}y[Ba_mTiO_3]\text{-}z[Bi_mAlO_3] \qquad (1)$$

wherein $0.5 \leq x \leq 0.7995$, $0.2 \leq y \leq 0.4$, $0.0005 \leq z \leq 0.1$, $x+y+z=1$, $0.96 \leq m \leq 1.04$.

5 Claims, 4 Drawing Sheets

(51) Int. Cl.
*C01G 49/00* (2006.01)
*C04B 35/26* (2006.01)

(56) References Cited

OTHER PUBLICATIONS

Rojac, Tadej et al., "Strong ferroelectric domain-wall pinning in BiFeO 3 ceramics.", Journal of Applied Physics, pp. 074107-1 to 074107-8, vol. 108, No. 074107, (2010).

Cen, Zhenyong et al., "Effect of sintering temperature on microstructure and piezoelectric properties of Pb-free 3iFeO3—BaTiO3 ceramics in the composition range of large BiFeO3 concentrations.", J Electroceram, pp. 15-20, vol. 31, (2013).

Aug. 7, 2018 extended Search Report issued in European Patent Application No. 18158981.3.

Cen Zhenyong et al, "Remarkably High-Temperature Stability of Bi(Fe1-xAlx)O3-BaTiO3 Solid Solution With Near-Zero Temperature Coefficient of Piezoelectric Properties", Journal of the American Ceramic Society, Jul. 2013, vol. 96, No. 7, pp. 2252-2256.

\* cited by examiner

PIEZOELECTRIC COMPOSITION AND PIEZOELECTRIC DEVICE

TECHNICAL FIELD

The present invention relates to a piezoelectric composition and a piezoelectric device.

BACKGROUND

A perovskite-type metal oxide is known as a common piezoelectric composition. The constitution of a perovskite-type metal oxide is represented by $ABO_3$. A perovskite-type piezoelectric composition is, for example, lead zirconate titanate (Pb(Zr, Ti)$O_3$). The curie temperature ($T_c$) of lead zirconate titanate (PZT) is high, and the piezoelectric constant ($d_{33}$) of PZT is large. However, PZT does harm to the environment or the human body due to containing lead as an element at A sites. The piezoelectric composition not containing lead is required in view of influence on the environment or the human body.

An example of the piezoelectric composition not containing lead is bismuth ferrite (BiFeO$_3$) described in the following Non Patent Literature 1. The Tc of bismuth ferrite (BFO) is high, and BFO exhibits large spontaneous polarization. However, in the case of BFO alone, enough piezoelectric performance (for example, $d_{33}$) is not obtained due to the anisotropy being high, the leakage current being large and the like.

Therefore, a piezoelectric composition the Tc of which is high and the $d_{33}$ of which is large is required. A binary compound composed of barium titanate and bismuth ferrite is disclosed in the following Non Patent Literature 2. A ternary compound composed of barium titanate, bismuth ferrite and a composite oxide such as bismuth magnesate titanate is disclosed in Japanese Unexamined Patent Publication 2013-191751.

[Non Patent literature 1] Tadej Rojac et al., "Strong ferroelectric domain-wall pinning in BiFeO3 ceramics", JOURNAL OF APPLIED PHYSICS, 108, 074107, 2010.
[Non Patent literature 2] Zhenyong Cen et al., "Effect of sintering temperature on microstructure and piezoelectric properties of Pb-free BiFeO3-BaTiO3 ceramics in the composition range of large BiFeO3 concentrations", J Electroceram, 31, p. 15-20, 2013.

SUMMARY

Problem to be Solved by the Invention

A piezoelectric composition described in Japanese Unexamined Patent Publication 2013-191751 is greatly distorted when an electric field high enough is impressed thereon. However, it is difficult for a piezoelectric composition described in Japanese Unexamined Patent Publication 2013-191751 to have a piezoelectric constant large enough after a poling process is performed thereon. Furthermore, when a poling process is performed on a piezoelectric composition described in Non Patent Literature 2, the $d_{33}$ of the piezoelectric composition after the poling process is around 130 pC/N, and is small.

Therefore, the present invention has been completed in view of the above circumstances, and an object of the present invention is to provide a piezoelectric composition the $d_{33}$ of which is large and the specific resistance of which is large and a piezoelectric device using the piezoelectric composition.

Means for Solving the Problem

A piezoelectric composition according to one aspect of the present invention is represented by the following Chemical Formula (1):

$$x[Bi_m FeO_3]\text{-}y[Ba_m TiO_3]\text{-}z[Bi_m AlO_3] \tag{1}$$

wherein $0.5 \leq x \leq 0.7995$, $0.2 \leq y \leq 0.4$, $0.0005 \leq z \leq 0.1$, $x+y+z=1$, and $0.96 \leq m \leq 1.04$.

A piezoelectric device according to one aspect of the present invention comprises the above piezoelectric composition.

Effects of Invention

According to the present invention, a piezoelectric composition the $d_{33}$ of which is large and the specific resistance of which is large and a piezoelectric device using the piezoelectric composition are provided.

DETAILED DESCRIPTION

Figure 1:
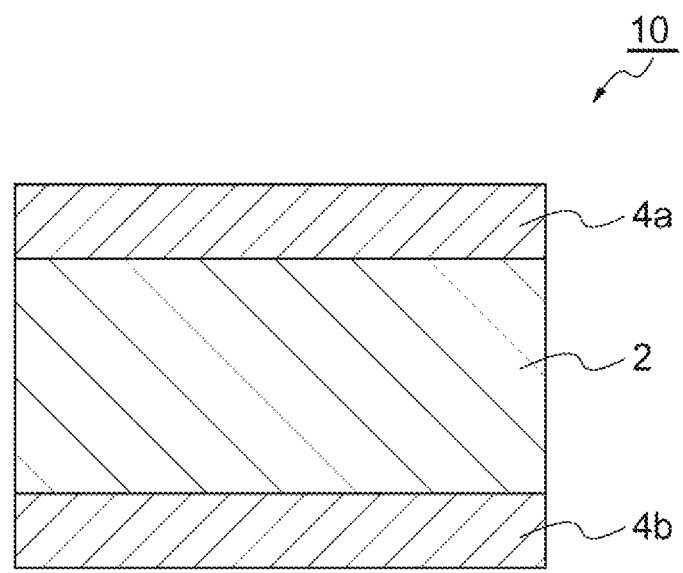
FIG. 1 is a sectional view of a piezoelectric device according to one embodiment of the present invention.

Preferred embodiments of the present invention will be described in detail hereinafter with proper reference to the drawings. In the drawings, the identical or equivalent components are indicated with the identical reference sign. When a description overlaps, the description is omitted. The present invention is not limited to the following embodiments.

As shown in FIG. 1, a piezoelectric device 10 according to this embodiment comprises a pair of electrodes 4a and 4b and a piezoelectric body 2 between the pair of electrodes 4a and 4b. That is, an electrode 4a overlaps one surface of the piezoelectric body 2, and a different electrode 4b overlaps the other surface of the piezoelectric body 2.

A piezoelectric composition contained in the piezoelectric body 2 is represented by the following Chemical Formula (1). The piezoelectric body 2 may consist of only the piezoelectric composition represented by the following Chemical Formula (1). The piezoelectric body 2 may contain other ingredients in addition to the piezoelectric composition represented by the following Chemical Formula (1). The piezoelectric composition represented by the following Chemical Formula (1) may be a powder, or may be a sintered body.

$$x[Bi_m FeO_3]\text{-}y[Ba_m TiO_3]\text{-}z[Bi_m AlO_3] \tag{1}$$

[In Formula (1), $0.5 \leq x \leq 0.7995$, $0.2 \leq y \leq 0.4$, $0.0005 \leq z \leq 0.1$, $x+y+z=1$, $0.96 \leq m \leq 1.04$].

The piezoelectric composition represented by the above Chemical Formula (1) may have a perovskite-type crystal structure. The piezoelectric composition represented by the above Chemical Formula (1) may be a composite oxide represented by the following Chemical Formula (2). The piezoelectric body 2 may consist of only the piezoelectric composition represented by the following Chemical Formula (2). The piezoelectric body 2 may contain other ingredients in addition to the piezoelectric composition represented by the following Chemical Formula (2).

$(Bi_{(x+z)}Ba_y)_m(Fe_xTi_yAl_z)O_3$     (2)

[In Formula (2), $0.5 \le x \le 0.7995$, $0.2 \le y \le 0.4$, $0.0005 \le z \le 0.1$, $x+y+z=1$, and $0.96 \le m \le 1.04$].

A portion of the piezoelectric composition may be a phase consisting of $Bi_mFeO_3$. A portion of the piezoelectric composition may be a phase consisting of $Ba_mTiO_3$. A portion of the piezoelectric composition may be a phase consisting of $Bi_mAlO_3$. A portion of the piezoelectric composition may be a solid solution of at least two oxides selected from the group consisting of $Bi_mFeO_3$, $Ba_mTiO_3$ and $Bi_mAlO_3$.

The present inventors consider that a reason the $d_{33}$ and the specific resistance of the above piezoelectric composition are large is as follows. In a process of sintering perovskite-type $BiFeO_3$ to form the piezoelectric body 2, Bi is likely to volatilize. Also in a process of forming a thin film containing $BiFeO_3$, Bi is likely to volatilize. For example, when a thin film is formed by a sputtering method, Bi is unlikely to be incorporated into the thin film in a growth process. Therefore, in conventional $BiFeO_3$, which does not contain Al, Bi is likely to be deficient and the number of the valences of Fe at B sites is likely to change from trivalent to divalent. When the numbers of the valences of Fe change from trivalent to divalent, charge transfer occurs, and the specific resistance of $BiFeO_3$ becomes small. Meanwhile, the piezoelectric composition according to this embodiment contains Al the number of the valence of which is unlikely to change. Therefore, some of B sites are replaced with Al, and a change in the numbers of the valences is likely to be suppressed. Consequently, the specific resistance of the piezoelectric composition according to this embodiment is larger than the specific resistance of conventional $BiFeO_3$. Furthermore, when the specific resistance of the piezoelectric composition is large, leakage current becomes unlikely to occur at the time when a poling process is performed. Consequently, the $d_{33}$ of the piezoelectric composition according to this embodiment is larger than the $d_{33}$ of conventional $BiFeO_3$. Since Al is a relatively stable element, it is difficult to replace most of B sites in $BiFeO_3$ with Al. Furthermore, when a large amount of Al is added to the raw materials of $BiFeO_3$, a phase (heterogeneous phase) consisting of Al is likely to be formed in a completed piezoelectric composition. For example, Al in an amount such that the z becomes 0.2 is used as a raw material, a phase (heterogeneous phase) consisting of Al is likely to be formed in a completed piezoelectric composition. Consequently, the domain inversion (polarization reversal) of the piezoelectric composition becomes unlikely to occur. Meanwhile, since the piezoelectric composition according to this embodiment is represented by the above Chemical Formula (1) and the z satisfies $0.0005 \le z \le 0.1$, the domain inversion is likely to occur. Consequently, the $d_{33}$ of the piezoelectric composition according to this embodiment is larger than the $d_{33}$ of conventional $BiFeO_3$. In addition, the reason the $d_{33}$ and the specific resistance of the piezoelectric composition according to this embodiment are large is not limited to the above reason.

In the above chemical formula (1), x satisfies $0.5 \le x \le 0.7995$. When the x is less than 0.5, the crystal structure of the piezoelectric composition shifts to a cubic crystal, and the $d_{33}$ of the piezoelectric composition is likely to become small. When the x is more than 0.7995, the crystal structure of the piezoelectric composition shifts to a rhombohedral crystal, the polarization reversal is unlikely to occur, the $d_{33}$ of the piezoelectric composition becomes small, many defects at A sites are caused by the volatilization of Bi, and the specific resistance is likely to decrease. It is preferable that the x satisfy $0.65 \le x \le 0.75$. Since the x is in the above numerical value range, the $d_{33}$ and the specific resistance of the piezoelectric composition are likely to become large.

In the above Chemical Formula (1), y satisfies $0.2 \le y \le 0.4$. When the y is less than 0.2, the crystal structure of a piezoelectric composition shifts to a rhombohedral crystal, the polarization reversal is unlikely to occur, the $d_{33}$ of a piezoelectric composition becomes small, many defects at A sites are caused by the volatilization of Bi, and the specific resistance is likely to decrease. When the y is more than 0.4, the crystal structure of the piezoelectric composition shifts to a cubic crystal, and the $d_{33}$ of the piezoelectric composition is likely to become small. It is preferable that the y satisfy $0.25 \le y \le 0.35$. Since the y is in the above numerical value range, the $d_{33}$ and the specific resistance of the piezoelectric composition are likely to become large.

In the above Chemical Formula (1), z satisfies $0.0005 \le z \le 0.1$. When the z is less than 0.0005, a fluctuation in the numbers of the valences of Fe at B sites cannot be suppressed, and the specific resistance is likely to decrease. When the z is more than 0.1, the content of Al exceeds the solid-solution limit of Al, and heterogeneous phases containing Al are formed in grain boundaries. Consequently, the $d_{33}$ of the piezoelectric composition is likely to become small. It is preferable that the z satisfy $0.0005 \le z \le 0.05$. Since the z is in the above numerical value range, the $d_{33}$ and the specific resistance of the piezoelectric composition are likely to become large.

In the above Chemical Formula (1), the m satisfies $0.96 \le m \le 1.04$. When the m is less than 0.96, Bi and Ba, which are at A sites, decrease, defects at A sites increase, and the specific resistance is likely to decrease. When the m is more than 1.04, heterogeneous phases containing either of Bi and Ba are formed in grain boundaries, and the $d_{33}$ of the piezoelectric composition is likely to become small. It is preferable that the m satisfy $0.98 \le m \le 1.02$. When the m is in the above numerical value range, the $d_{33}$ and the specific resistance of a piezoelectric composition are likely to become large.

The above Chemical Formula (2) is represented as $A_mBO_3$. The m is the ratio [A]/[B] of the number [A] of all atoms occupying A sites to the number [B] of all atoms occupying B sites. When the m is out of the above numerical value range, the m, namely the [A]/[B], greatly deviates from a stoichiometric ratio of 1, and therefore defects in the piezoelectric composition are likely to increase and heterogeneous phases are likely to increase in grain boundaries, thereby the $d_{33}$ and the specific resistance of the piezoelectric composition are likely to become small.

Figure 2:
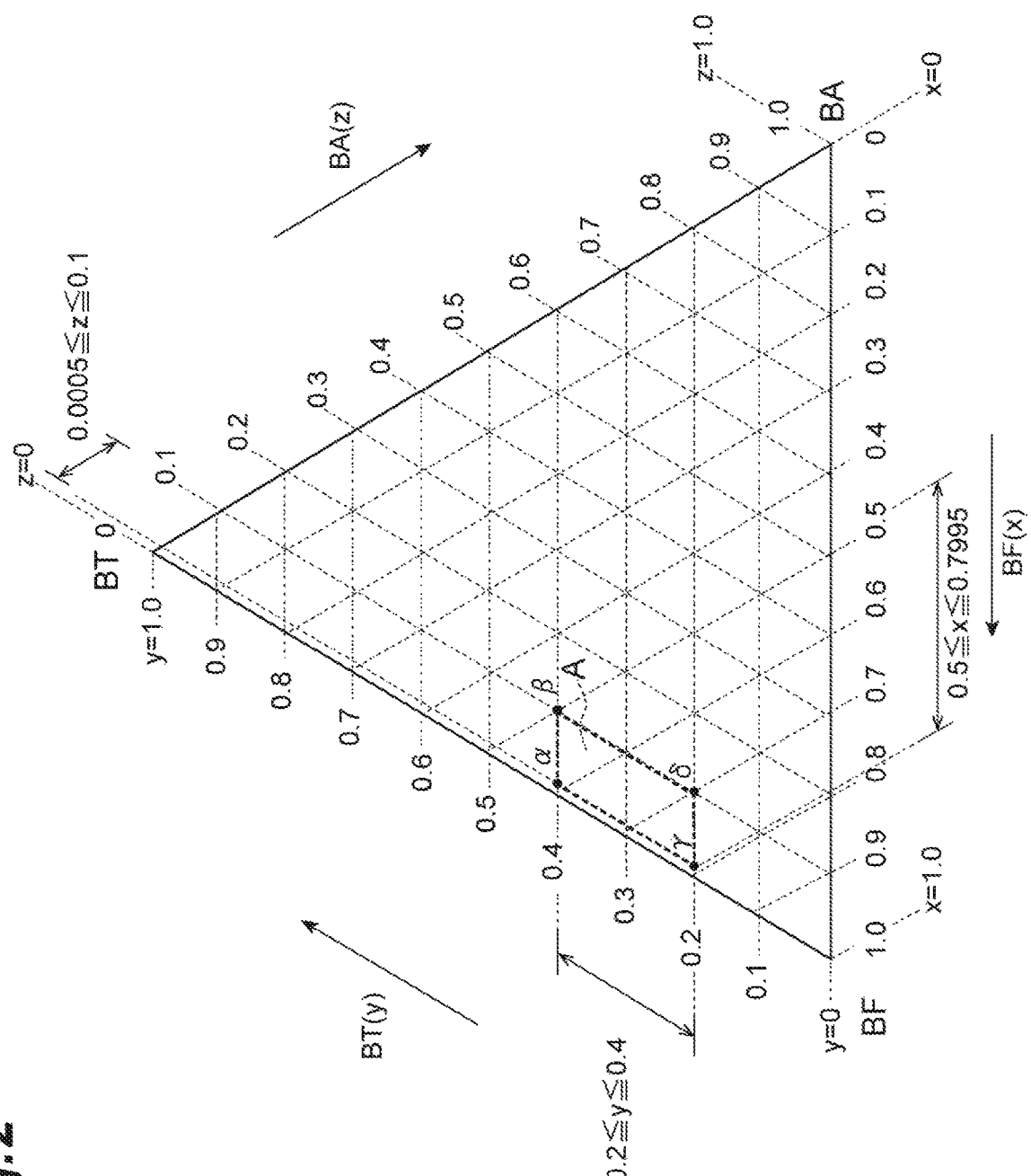
FIG. 2 is a schematic view illustrating the constitutions of piezoelectric compositions according to one embodiment of the present invention.

FIG. 2 is a schematic view illustrating the constitutions of the piezoelectric compositions according to this embodiment. BF means $BiFeO_3$ in FIG. 2. BT means $BaTiO_3$. BA means $BiAlO_3$. The constitutions of the piezoelectric compositions are illustrated by coordinates (x, y, z) in FIG. 2. Coordinates α (x, y, z) are (0.5995, 0.4, 0.0005). Coordinates β (x, y, z) are (0.5, 0.4, 0.1). Coordinates γ (x, y, z) are (0.7995, 0.2, 0.0005). Coordinates δ (x, y, z) are (0.7, 0.2, 0.1). A range surrounded by dotted lines connecting the coordinates α, β, γ and δ is defined as a range A. The range A is in the range of the constitutions of the piezoelectric compositions according to the present invention.

The piezoelectric composition may contain other elements than the elements contained in the above Chemical Formula (1) as impurities or minute amounts of additives in the form of compounds or simple substances. Examples of such a compound include oxides of Na, Al, Si, P, K, Fe, Cu, Zn, Hf, Ta, or W. When the piezoelectric composition contains these oxides and the like, it is preferable that the total content of oxides in the piezoelectric composition be 0.3% by mass or less of the whole piezoelectric composition in terms of oxides of the elements. That is, it is preferable that the main ingredient, specifically 99.7% by mass or more of the whole piezoelectric composition, have the constitution represented by Chemical Formula (1). In this case, the piezoelectric composition substantially has the constitution represented by Chemical Formula (1).

The constitution of the piezoelectric composition can be measured, for example, by an X-ray fluorescence analysis (XRF method).

Since the piezoelectric device 10 comprises the piezoelectric body 2 containing the piezoelectric composition represented by the above Chemical Formula (1), it is excellent in piezoelectric characteristics. The piezoelectric body 2 may be a sintered body containing the above piezoelectric composition, or may be a thin film containing the above piezoelectric composition.

The potential difference between a pair of electrodes 4a and 4b may be, for example, 0.1 to 2.0 kV/mm. In a piezoelectric device using conventional $BiFeO_3$, as long as the potential difference between the electrodes of the piezoelectric device is not a high voltage of 5.0 kV/mm or more, enough piezoelectric characteristics are not obtained. Meanwhile, in the piezoelectric device 10 according to this embodiment, even if the potential difference between the electrodes 4a and 4b is a low voltage in the above numerical value range or a high voltage higher than the above numerical value range, enough piezoelectric characteristics can be obtained.

Then, an example of a method for manufacturing the piezoelectric device 10 according to this embodiment will be described. The method for manufacturing the piezoelectric device 10 comprises: a mixing step of granulating a raw material powder of the piezoelectric body 2 containing the above piezoelectric composition; a sintering step of press-forming this raw material powder to form a formed body and sintering the formed body to produce a sintered body; and a polarization step of performing a poling process on the sintered body to obtain the piezoelectric device 10. Steps will be described specifically hereinafter.

In a mixing step, starting raw materials for preparing the piezoelectric composition are first provided. As the starting raw materials, oxides of elements that constitute the piezoelectric composition represented by the above Chemical Formula (1) or compounds that become these oxides after sintering (carbonates, hydroxides, oxalates, nitrates and the like) can be used. As specific starting raw materials, a Bi (bismuth) compound, a Fe (iron) compound, a Ba (barium) compound, a Ti (titanium) compound, an Al (aluminum) compound and the like may be used. These starting raw materials are blended at a molar ratio or a mass ratio such that the piezoelectric composition represented by the above Chemical Formula (1) is formed after sintering, and wet mixing is conducted by a ball mill or the like.

The Bi compound may be bismuth oxide ($Bi_2O_3$), bismuth nitrate ($Bi(NO_3)_3$) or the like. The Fe compound may be iron oxide ($Fe_2O_3$), iron chloride ($FeCl_3$), iron nitrate ($Fe(NO_3)_3$) or the like. The Ba compound may be barium oxide (BaO), barium carbonate ($BaCO_3$), barium oxalate ($C_2BaO_4$), barium acetate (($CH_3COO)_2Ba$), barium nitrate ($Ba(NO_3)_2$), barium sulfate ($BaSO_4$), barium titanate ($BaTiO_3$) or the like. The Ti compound may be titanium oxide ($TiO_2$) or the like. The Al compound may be aluminum oxide ($Al_2O_3$) or the like.

Then, the mixed raw material obtained by wet mixing is temporarily formed into a temporarily formed body, which is then calcined. A calcined body containing the above piezoelectric composition is obtained by this calcination. It is preferable that the calcination temperature be 600 to 900° C., and it is preferable that the calcination time be around 1 to 16 hours. When the calcination temperature is too low, a chemical reaction tends not to proceed fully in the temporarily formed body. When the calcination temperature is too high, a temporarily formed body begins to sinter, and subsequent pulverization therefore tends to become difficult. Calcination may be performed in the air atmosphere, and may be performed in an atmosphere in which the partial pressure of oxygen is higher than that in the air, or a pure oxygen atmosphere. Furthermore, the wet-mixed starting raw material may be calcined without being temporarily formed.

Then, the obtained calcined body is slurried and pulverized (wet ground) by a ball mill or the like, and thereafter a fine powder is obtained by drying the slurry. A binder is added to the obtained fine powder if needed, and the raw material powder is granulated. It is preferable to use water, an alcohol such as ethanol, a mixed solvent of water and ethanol, or the like as a solvent for slurrying a calcined body. Binders added to the fine powder include commonly used organic binders such as polyvinyl alcohol, polyvinyl alcohol to which a dispersing agent is added, ethyl cellulose, and the like.

In a sintering step, a formed body is formed by press-forming the granulated raw material powder. A load at the time of press-forming may be adjusted, for example, to 1.0 to 3.5 MPa.

Then, binder removal treatment is provided to the obtained formed body. It is preferable that the binder removal treatment be performed at a temperature of 400 to 800° C. for around 2 to 4 hours. The binder removal treatment may be performed in the air atmosphere, or may be performed in an atmosphere in which the partial pressure of oxygen is higher than that in the air, or a pure oxygen atmosphere.

A sintered body containing the piezoelectric composition represented by the above Chemical Formula (1) is obtained by sintering the formed body after the binder removal treatment. The sintering temperature may be about 900 to 1100° C., and the sintering time may be adjusted to around 2 to 20 hours. The binder removal treatment and the sintering of the formed body may be performed successively, or may be performed separately.

The surface of the obtained sintered body is polished if needed, and the sintered body is processed such that the sintered body is cut to form the desired shape of a piezoelectric body 2. A pair of electrodes 4a and 4b is formed on both surfaces of the processed sintered body. The electrodes 4a and 4b may be formed by applying and baking an electrode paste, or may be formed by vapor deposition or sputtering film formation.

A piezoelectric device 10 according to this embodiment can be obtained by impressing a polarization electric field on the sintered body on which the electrodes are formed and performing a poling process. The conditions of the poling process may be properly determined depending on the constitution of the piezoelectric composition that the sintered body contains. The conditions of the poling process may be, for example, as follows. The sintered body may be immersed into silicone oil at 25 to 200° C. The time to impress a polarization electric field may be 5 to 60 minutes. The magnitude of a polarization electric field may be 1.2 or more times greater than that of the coercive electric field of the sintered body.

The uses of a piezoelectric composition according to this embodiment are various. The piezoelectric composition may be applied, for example, to a radiator, a resonator, an actuator, a motor or a sensor. The specific use of the piezoelectric composition may be, for example, a SAW filter, a BAW filter, a piezoelectric microphone, a head assembly, a hard disk drive, a printer head, an ink jet printer device, an ultrasonic washing machine, an ultrasonic motor, an atomizer oscillator, a fish finder, a shocking sensor, an ultrasonic diagnostic device, a waste toner sensor, a gyro sensor, a buzzer, a transformer, or a lighter.

As mentioned above, preferable embodiments of the present invention were described, but the present invention is not necessarily limited to the embodiments mentioned above. Various modifications of the present invention are possible as long as the modifications do not deviate from aims of the present invention, and these modification examples are included in the present invention.

EXAMPLES

The present invention will be described in detail by using Examples and Comparative Example hereinafter. However, the present invention is not limited to the following Examples at all.

Example 1

A piezoelectric device was manufactured by a method illustrated below. As raw materials of the piezoelectric composition, raw material powders of bismuth oxide ($Bi_2O_3$), iron oxide ($Fe_2O_3$), barium carbonate ($BaCO_3$), titanium oxide ($TiO_2$) and aluminum oxide ($Al_2O_3$) were provided. These raw material powders were weighed and blended, and the mixed raw material was prepared such that a sintered body after the final sintering became a piezoelectric composition represented by the following Chemical Formula (3).

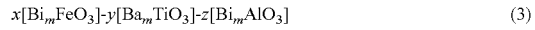

$$x[Bi_mFeO_3]\text{-}y[Ba_mTiO_3]\text{-}z[Bi_mAlO_3] \qquad (3)$$

In the above Chemical Formula (3), x=0.5995, y=0.4, z=0.0005, and m=1.02.

Then, the prepared mixed raw material and pure water were mixed with Zr balls by a ball mill for 10 hours to obtain slurry. This slurry was fully dried, thereafter press-forming and calcined at 800° C. to obtain a calcined body. Next, the calcined body was pulverized by the ball mill and thereafter dried, a proper amount of PVA (polyvinyl alcohol) was added thereto as a binder, and the mixture was granulated. Around 3 g of the obtained granulated powder was placed into a metal mold of 20 mm in length by 20 mm in width and formed under a load of 3.2 MPa by using a uniaxial press molding machine.

The molded sample was heat-treated to remove the binder therefrom and thereafter finally sintered at 950 to 1100° C. for 4 hours to obtain a sintered body.

The obtained sintered body was flattened to a thickness of 0.5 mm with a double side lapping machine and thereafter cut to a size of 16 mm in length by 16 mm in width with a dicing saw. Subsequently, electrodes 4a and 4b were formed on both surfaces of the sintered body by using a vacuum evaporator. The electrodes 4a and 4b were composed of 1.5-μm Ag layers. The sizes of the electrodes were 15 mm by 15 mm.

Thereafter, a poling process in which 1.5 to 2 times as strong an electric field as the coercive electric field was impressed on the sintered body on which the electrodes were formed in a silicone oil bath at a temperature of 120° C. for 15 minutes was performed to obtain a piezoelectric device 10 having the same configuration as FIG. 1.

[Analysis of Constitution]

The constitution of the sintered body in Example 1 was analyzed by an X-ray fluorescence analysis (XRF method). Consequently, it has been confirmed that the constitution of the sintered body in Example 1 is represented by the above Chemical Formula (3).

[Measurement of $d_{33}$]

The $d_{33}$ (unit: pC/N) of the sintered body (piezoelectric composition) in Example 1 before the forming of temporary electrodes was measured by using a $d_{33}$ meter. The above $d_{33}$ meter measures $d_{33}$ by the Berlincourt method based on JIS R 1696. In the Berlincourt method, the $d_{33}$ is measured by utilizing a piezoelectric positive effect at the time when vibration is given to a piezoelectric composition. Therefore, in the Berlincourt method, there is no influence of electrostriction differently from a measuring method in which a piezoelectric reverse effect at the time when an electric field is impressed on a piezoelectric composition is utilized, and the original $d_{33}$ of a piezoelectric composition is obtained. The $d_{33}$ in Example 1 is illustrated in Table 2. The $d_{33}$ is good when it is 150 pC/N or more.

[Measurement of Specific Resistance]

Direct-current voltage was impressed between the electrode 4a and the electrode 4b in the piezoelectric device in Example 1, and the specific resistance (unit: Ω·cm) between the electrode 4a and the electrode 4b was measured. The direct-current voltage was 40 V. The specific resistance in Example 1 is illustrated in Table 2. The specific resistance is good when it is $1.0 \times 10^9$ Ω·cm or more.

Examples 2 to 29 and Comparative Examples 1 to 26

Respective piezoelectric devices in Examples 2 to 29 and Comparative Examples 1 to 26 were individually manufactured by the same method as Example 1 except that the ratios of powder raw materials blended were altered such that x, y, z, and m in the above Chemical Formula (3) became values illustrated in the following Tables 1 to 8 when mixed raw materials were prepared. The respective constitutions of the sintered bodies in Examples 2 to 29 and Comparative Examples 1 to 26 were analyzed by the same method as Example 1. Consequently, it has been confirmed that the respective constitutions of the sintered bodies in Examples 2 to 29 and Comparative Examples 1 to 26 are the constitutions illustrated in Tables 1 to 8. The $d_{33}$s of Examples 2 to 29 and Comparative Examples 1 to 26 were measured individually by the same method as Example 1. The $d_{33}$s of Examples 2 to 29 and Comparative Examples 1 to 26 are illustrated in Tables 1 to 8. The specific resistances in Examples 2 to 29 and the Comparative Examples 1 to 26 were measured individually by the same method as Example 1. The specific resistances in Examples 2 to 29 and Comparative Examples 1 to 26 are illustrated in Tables 1 to 8.

TABLE 1

| Table 1 | BiFeO$_3$ x | BaTiO$_3$ y | BiAlO$_3$ z | A/B m | d$_{33}$ (pC/N) — | Specific resistance (Ω · cm) — |
|---|---|---|---|---|---|---|
| Comparative Example 1 | 0.5500 | 0.4500 | 0.0000 | 1.02 | 99 | $4.450 \times 10^9$ |
| Comparative Example 2 | 0.5495 | | 0.0005 | 1.02 | 122 | $2.789 \times 10^{10}$ |
| Comparative Example 3 | 0.5490 | | 0.0010 | 1.02 | 129 | $9.345 \times 10^{10}$ |
| Comparative Example 4 | 0.5400 | | 0.0100 | 1.02 | 130 | $6.725 \times 10^{11}$ |
| Comparative Example 5 | 0.5000 | | 0.0500 | 1.02 | 128 | $7.688 \times 10^{11}$ |
| Comparative Example 6 | 0.4500 | | 0.1000 | 1.02 | 118 | $6.912 \times 10^{10}$ |
| Comparative Example 7 | 0.4200 | | 0.1300 | 1.02 | 103 | $4.810 \times 10^9$ |

TABLE 2

| Table 2 | BiFeO$_3$ x | BaTiO$_3$ y | BiAlO$_3$ z | A/B m | d$_{33}$ (pC/N) — | Specific resistance (Ω · cm) — |
|---|---|---|---|---|---|---|
| Comparative Example 8 | 0.6000 | 0.4000 | 0.0000 | 1.02 | 156 | $1.430 \times 10^8$ |
| Example 1 | 0.5995 | | 0.0005 | 1.02 | 181 | $1.115 \times 10^{11}$ |
| Example 2 | 0.5990 | | 0.0010 | 1.02 | 190 | $7.769 \times 10^{11}$ |
| Example 3 | 0.5900 | | 0.0100 | 1.02 | 194 | $5.312 \times 10^{11}$ |
| Example 4 | 0.5500 | | 0.0500 | 1.02 | 188 | $2.778 \times 10^{10}$ |
| Example 5 | 0.5000 | | 0.1000 | 1.02 | 177 | $3.988 \times 10^9$ |
| Comparative Example 9 | 0.4700 | | 0.1300 | 1.02 | 159 | $3.194 \times 10^8$ |

TABLE 3

| Table 3 | BiFeO$_3$ x | BaTiO$_3$ y | BiAlO$_3$ z | A/B m | d$_{33}$ (pC/N) — | Specific resistance (Ω · cm) — |
|---|---|---|---|---|---|---|
| Comparative Example 10 | 0.6500 | 0.3500 | 0.0000 | 1.02 | 201 | $5.140 \times 10^8$ |
| Example 6 | 0.6495 | | 0.0005 | 1.02 | 233 | $8.242 \times 10^{10}$ |
| Example 7 | 0.6490 | | 0.0010 | 1.02 | 246 | $6.117 \times 10^{10}$ |
| Example 8 | 0.6400 | | 0.0100 | 1.02 | 249 | $5.312 \times 10^{11}$ |
| Example 9 | 0.6000 | | 0.0500 | 1.02 | 240 | $5.777 \times 10^{10}$ |
| Example 10 | 0.5500 | | 0.1000 | 1.02 | 235 | $1.422 \times 10^9$ |
| Comparative Example 11 | 0.5200 | | 0.1300 | 1.02 | 213 | $3.194 \times 10^8$ |

TABLE 4

| Table 4 | BiFeO$_3$ x | BaTiO$_3$ y | BiAlO$_3$ z | A/B m | d$_{33}$ (pC/N) — | Specific resistance (Ω · cm) — |
|---|---|---|---|---|---|---|
| Comparative Example 12 | 0.7000 | 0.3000 | 0.0000 | 1.02 | 228 | $5.322 \times 10^8$ |
| Example 11 | 0.6995 | | 0.0005 | 1.02 | 244 | $1.978 \times 10^{10}$ |
| Example 12 | 0.6990 | | 0.0010 | 1.02 | 253 | $5.165 \times 10^{11}$ |
| Example 13 | 0.6900 | | 0.0100 | 1.02 | 255 | $9.345 \times 10^{10}$ |
| Example 14 | 0.6500 | | 0.0500 | 1.02 | 248 | $7.688 \times 10^{11}$ |
| Example 15 | 0.6000 | | 0.1000 | 1.02 | 242 | $6.912 \times 10^{10}$ |
| Comparative Example 13 | 0.5700 | | 0.1300 | 1.02 | 231 | $4.810 \times 10^8$ |

TABLE 5

| Table 5 | BiFeO$_3$ x | BaTiO$_3$ y | BiAlO$_3$ z | A/B m | d$_{33}$ (pC/N) — | Specific resistance (Ω · cm) — |
|---|---|---|---|---|---|---|
| Comparative Example 14 | 0.7500 | 0.2500 | 0.0000 | 1.02 | 177 | $2.588 \times 10^8$ |
| Example 16 | 0.7495 | | 0.0005 | 1.02 | 205 | $4.427 \times 10^{10}$ |
| Example 17 | 0.7490 | | 0.0010 | 1.02 | 215 | $7.185 \times 10^{10}$ |
| Example 18 | 0.7400 | | 0.0100 | 1.02 | 221 | $6.587 \times 10^{10}$ |
| Example 19 | 0.7000 | | 0.0500 | 1.02 | 220 | $1.611 \times 10^{11}$ |
| Example 20 | 0.6500 | | 0.1000 | 1.02 | 209 | $3.515 \times 10^{10}$ |
| Comparative Example 15 | 0.6200 | | 0.1300 | 1.02 | 189 | $1.118 \times 10^8$ |

TABLE 6

| Table 6 | BiFeO$_3$ x | BaTiO$_3$ y | BiAlO$_3$ z | A/B m | d$_{33}$ (pC/N) | Specific resistance (Ω · cm) |
|---|---|---|---|---|---|---|
| Comparative Example 16 | 0.8000 | 0.2000 | 0.0000 | 1.02 | 139 | 1.122 × 10$^8$ |
| Example 21 | 0.7995 | | 0.0005 | 1.02 | 158 | 4.465 × 10$^9$ |
| Example 22 | 0.7990 | | 0.0010 | 1.02 | 177 | 1.134 × 10$^{10}$ |
| Example 23 | 0.7900 | | 0.0100 | 1.02 | 178 | 6.351 × 10$^{10}$ |
| Example 24 | 0.7500 | | 0.0500 | 1.02 | 176 | 8.766 × 10$^{10}$ |
| Example 25 | 0.7000 | | 0.1000 | 1.02 | 160 | 2.267 × 10$^9$ |
| Comparative Example 17 | 0.6700 | | 0.1300 | 1.02 | 148 | 5.288 × 10$^8$ |

TABLE 7

| Table 7 | BiFeO$_3$ x | BaTiO$_3$ y | BiAlO$_3$ z | A/B m | d$_{33}$ (pC/N) | Specific resistance (Ω · cm) |
|---|---|---|---|---|---|---|
| Comparative Example 18 | 0.8500 | 0.1500 | 0.0000 | 1.02 | 65 | 2.789 × 10$^8$ |
| Comparative Example 19 | 0.8495 | | 0.0005 | 1.02 | 120 | 5.234 × 10$^{10}$ |
| Comparative Example 20 | 0.8490 | | 0.0010 | 1.02 | 135 | 9.111 × 10$^{10}$ |
| Comparative Example 21 | 0.8400 | | 0.0100 | 1.02 | 133 | 3.251 × 10$^{11}$ |
| Comparative Example 22 | 0.8000 | | 0.0500 | 1.02 | 131 | 9.911 × 10$^{10}$ |
| Comparative Example 23 | 0.7500 | | 0.1000 | 1.02 | 128 | 5.769 × 10$^9$ |
| Comparative Example 24 | 0.7200 | | 0.1300 | 1.02 | 105 | 5.288 × 10$^8$ |

TABLE 8

| Table 8 | BiFeO$_3$ x | BaTiO$_3$ y | BiAlO$_3$ z | A/B m | d$_{33}$ (pC/N) | Specific resistance (Ω · cm) |
|---|---|---|---|---|---|---|
| Comparative Example 25 | 0.6900 | 0.3000 | 0.0100 | 0.94 | 194 | 2.159 × 10$^8$ |
| Example 26 | | | | 0.96 | 225 | 3.365 × 10$^9$ |
| Example 27 | | | | 0.98 | 244 | 9.345 × 10$^{11}$ |
| Example 28 | | | | 1.00 | 250 | 2.551 × 10$^{10}$ |
| Example 13 | | | | 1.02 | 255 | 9.345 × 10$^{11}$ |
| Example 29 | | | | 1.04 | 238 | 8.798 × 10$^9$ |
| Comparative Example 26 | | | | 1.06 | 201 | 1.453 × 10$^8$ |

Figure 3:
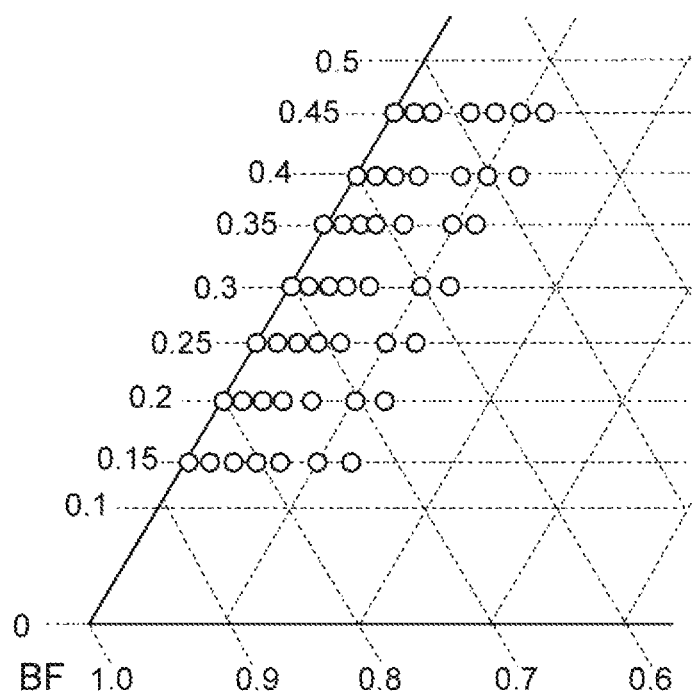
FIG. 3 is an enlarged view of a portion of FIG. 2, and is a schematic view illustrating the constitutions of piezoelectric compositions in Examples and Comparative Examples.
Figure 4:
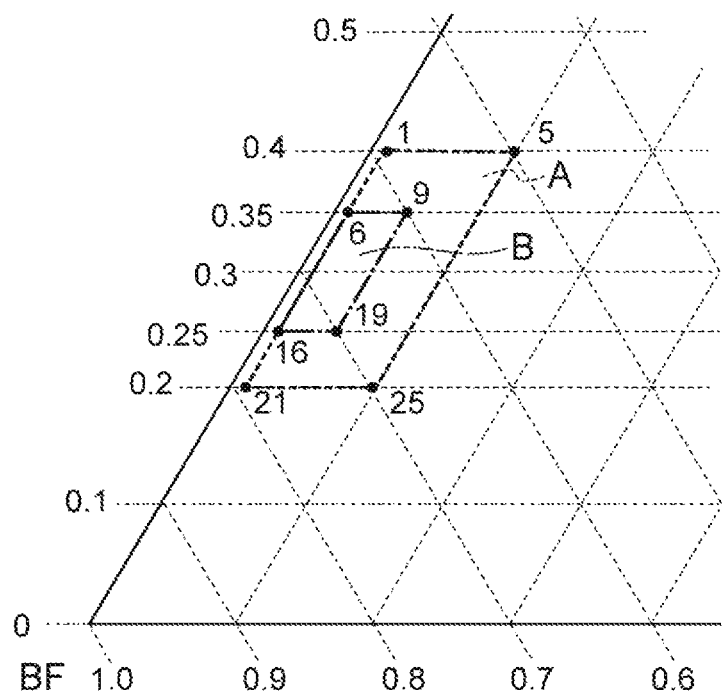
FIG. 4 is an enlarged view of a portion of FIG. 2, and is a schematic view illustrating the constitutions of piezoelectric compositions in Examples.

FIGS. 3 and 4 are enlarged views of portions of FIG. 2. In FIG. 3, the coordinates of a round mark indicate the constitution of a piezoelectric composition in Example or Comparative Example. In FIG. 4, a number appended to a round mark is the number of Example. The coordinates (x, y, z) of Example 1 are the same as the coordinates α in FIG. 2, and are (0.5995, 0.4, 0.0005). The coordinates (x, y, z) of Example 5 are the same as the coordinates β in FIG. 2, and are (0.5, 0.4, 0.1). The coordinates (x, y, z) of Example 21 are the same as the coordinates γ in FIG. 2, and are (0.7995, 0.2, 0.0005). The coordinates (x, y, z) of Example 25 are the same as the coordinates δ in FIG. 2, and are (0.7, 0.2, 0.1). A range surrounded by dotted lines connecting the coordinates of Examples 1, 5, 21 and 25 is the same as the range A in FIG. 2. The coordinates (x, y, z) of Example 6 are (0.6495, 0.35, 0.0005). The coordinates (x, y, z) of Example 9 are (0.6, 0.35, 0.05). The coordinates (x, y, z) of Example 16 are (0.7495, 0.25, 0.0005). The coordinates (x, y, z) of Example 19 are (0.7, 0.25, 0.05). A range surrounded by dashed lines connecting the coordinates of Examples 6, 9, 16 and 19 is defined as a range B. The piezoelectric compositions belonging to the range B are superior to the piezoelectric compositions belonging to the above range A in the point that at least either of the d$_{33}$ and the specific resistance is likely to become large.

From the above experimental results, it has been confirmed that all the Examples are in the range of the piezoelectric composition represented by the above Chemical Formula (1). Meanwhile, it has been confirmed that all the Comparative Examples are out of the range of the piezoelectric composition represented by the above Chemical Formula (1).

As illustrated in Tables 1 to 8, the d$_{33}$s of all the Examples were 150 pC/N or more, and the specific resistances of all the Examples were 1.0×10$^9$ Ω·cm or more. Meanwhile, there was no Comparative Examples the d$_{33}$s of which were 150 pC/N or more and the specific resistances of which were 1.0×10$^9$ Ω·cm or more. It has been confirmed that a piezoelectric composition the d$_{33}$ of which is large and the specific resistance of which is large and a piezoelectric device using the piezoelectric composition are provided according to the present invention.

REFERENCE SIGNS LIST

2: piezoelectric body; 4a, 4b: electrode; 10: piezoelectric device.

What is claimed is:

1. A piezoelectric composition represented by a following Chemical Formula (1):

$$x[Bi_mFeO_3]\text{-}y[Ba_mTiO_3]\text{-}z[Bi_mAlO_3] \quad (1)$$

wherein 0.6500≤x≤0.7995, 0.2000≤y≤0.2500, 0.0005≤z≤0.100, x+y+z=1, and 0.96≤m≤1.04, or 0.5000≤x≤0.6995, 0.3000≤y≤0.4000, 0.0005≤z≤0.100, x+y+z=1, and 0.96≤m≤1.04, wherein the piezoelectric composition has a piezoelectric constant d33 of 158 pC/N or more, and a specific resistance of $1.0 \times 10^9$ Ω·cm or more.

2. The piezoelectric composition according to claim 1, wherein $0.65 \leq x \leq 0.75$.

3. The piezoelectric composition according to claim 1, wherein $0.0005 \leq z \leq 0.05$.

4. The piezoelectric composition according to claim 1, wherein $0.98 \leq m \leq 1.02$.

5. A piezoelectric device comprising:
the piezoelectric composition according to claim 1.

* * * * *